(12) United States Patent
Daugherty et al.

(10) Patent No.: US 9,337,002 B2
(45) Date of Patent: May 10, 2016

(54) CORROSION RESISTANT ALUMINUM COATING ON PLASMA CHAMBER COMPONENTS

(71) Applicant: Lam Research Corporation, Fremont, CA (US)

(72) Inventors: John Daugherty, Fremont, CA (US); Hong Shih, Walnut, CA (US); Lin Xu, Katy, TX (US); Anthony Amadio, Mountain View, CA (US); Robert G. O'Neill, Fremont, CA (US); Peter Holland, Pleasanton, CA (US); Sivakami Ramanathan, Fremont, CA (US); Tae Won Kim, Dublin, CA (US); Duane Outka, Fremont, CA (US); John Michael Kerns, Livermore, CA (US); Sonia Castillo, Hayward, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 33 days.

(21) Appl. No.: 13/796,751

(22) Filed: Mar. 12, 2013

(65) Prior Publication Data

US 2014/0272459 A1    Sep. 18, 2014

(51) Int. Cl.
*C22C 21/00*    (2006.01)
*C23C 24/04*    (2006.01)
*B32B 15/01*    (2006.01)
(Continued)

(52) U.S. Cl.
CPC ............ *H01J 37/32477* (2013.01); *C22C 21/00* (2013.01); *C22C 21/08* (2013.01); *C23C 24/04* (2013.01); *C23C 28/322* (2013.01); *C23C 28/345* (2013.01); *H01J 37/32495* (2013.01); *H01J 37/32559* (2013.01); *Y10T 428/12764* (2015.01); *Y10T 428/218* (2015.01); *Y10T 428/2495* (2015.01); *Y10T 428/24355* (2015.01); *Y10T 428/24967* (2015.01); *Y10T 428/26* (2015.01); *Y10T 428/31678* (2015.04)

(58) Field of Classification Search
CPC ...................................................... B05D 1/12
USPC ......... 428/620, 621, 627, 628, 629, 632, 650, 428/654; 427/201
See application file for complete search history.

(56) References Cited

U.S. PATENT DOCUMENTS 4,504,325 A   3/1985   Moji
4,775,427 A   10/1988  Portz et al.
(Continued)

*Primary Examiner* — Humera Sheikh
*Assistant Examiner* — Lucas Wang
(74) *Attorney, Agent, or Firm* — Buchanan Ingersoll & Rooney PC

(57) ABSTRACT

Components of semiconductor material processing chambers are disclosed, which may include a substrate and at least one corrosion-resistant coating formed on a surface thereof. The at least one corrosion-resistant coating is a high purity metal coating formed by a cold-spray technique. An anodized layer can be formed on the high purity metal coating. The anodized layer comprises a process-exposed surface of the component. Semiconductor material processing apparatuses including one or more of the components are also disclosed, the components being selected from the group consisting of a chamber liner, an electrostatic chuck, a focus ring, a chamber wall, an edge ring, a plasma confinement ring, a substrate support, a baffle, a gas distribution plate, a gas distribution ring, a gas nozzle, a heating element, a plasma screen, a transport mechanism, a gas supply system, a lift mechanism, a load lock, a door mechanism, a robotic arm and a fastener. Methods of making the components and methods of plasma processing using the components are also disclosed.

21 Claims, 5 Drawing Sheets

(51) Int. Cl.
  *H01J 37/32* (2006.01)
  *C22C 21/08* (2006.01)
  *C23C 28/00* (2006.01)
  *H01J 37/00* (2006.01)

(56) References Cited

U.S. PATENT DOCUMENTS

| | | |
|---|---|---|
| 6,139,713 A | 10/2000 | Masuda et al. |
| 6,491,208 B2 | 12/2002 | James et al. |
| 6,511,532 B2 | 1/2003 | Matzdorf et al. |
| 7,507,670 B2 | 3/2009 | Shih et al. |
| 7,579,067 B2 | 8/2009 | Lin et al. |
| 8,128,750 B2 | 3/2012 | Kenworthy et al. |
| 2004/0050710 A1* | 3/2004 | Yan ............................ 205/221 |
| 2006/0093736 A1 | 5/2006 | Raybould et al. |
| 2006/0134320 A1 | 6/2006 | DeBiccari et al. |
| 2006/0169592 A1 | 8/2006 | Mardilovich et al. |
| 2008/0241517 A1* | 10/2008 | Kenworthy et al. .......... 428/332 |
| 2009/0148622 A1 | 6/2009 | Stoltenhoff et al. |
| 2010/0000869 A1 | 1/2010 | Bai et al. |
| 2010/0155251 A1* | 6/2010 | Bogue et al. .................... 205/81 |
| 2011/0146704 A1 | 6/2011 | Shih et al. |
| 2012/0103526 A1 | 5/2012 | Ouye et al. |
| 2012/0141661 A1 | 6/2012 | Cho et al. |
| 2012/0193450 A1 | 8/2012 | Kay et al. |

\* cited by examiner

CORROSION RESISTANT ALUMINUM COATING ON PLASMA CHAMBER COMPONENTS

FIELD OF THE INVENTION

The present disclosure relates to high-purity aluminum corrosion-resistant coatings on plasma processing chamber parts. More specifically, the present disclosure relates to high-purity corrosion-resistant Al coatings obtained by cold-spraying. Such high-purity corrosion-resistant coatings may be anodized to impart further corrosion-resistance.

BACKGROUND

In the field of semiconductor material processing, semiconductor material processing apparatuses including vacuum processing chambers are used, for example for etching and chemical vapor deposition (CVD) of various materials on substrates, and for resist stripping. Some of these processes utilize corrosive and erosive process gases and plasma in such processing chambers. It is desirable to minimize particle and/or metal contamination of substrates processed in the chambers. Accordingly, it is desirable that plasma-exposed components of such apparatuses be resistant to corrosion when exposed to such gases and plasma.

Aluminum alloys such as Al6061-T6 and Al5052 have been using as plasma processing chamber materials since the 1980s. Since many aggressive and reactive gases such as $Cl_2$, HCl, HBr, $SF_6$, and $NF_3$ are used in plasma processing chambers, aluminum alloys have to undergo surface modification to form a coating which can provide higher corrosion resistance and longer part lifetimes. Among aluminum alloys, both 6XXX and 5XXX series of aluminum alloys are attractive aluminum substrates. For example, Al 5XXX series alloys have moderate to high strength, good weldability, and high corrosion resistance of anodic film. Al6XXX series alloys are heat treatable, good formability, weldability, machinability, and high corrosion resistance of anodic film. For Al5XXX alloys, magnesium (Mg) is the principal alloying element. For Al 6XXX alloys, magnesium and silicon are the principal alloying elements. These aluminum alloys may also contain other alloying elements such as Fe, Cu, Zn, and Mn.

With semiconductor wafer etch feature size shrinkage to 28 nm, 20 nm and even 14 nm, metal contamination reduction in such aluminum alloys becomes more and more critical. For example, it is desirable to reduce Fe contamination levels from about $1 \times 10^{10}$ atoms/$cm^2$ down to about $1 \times 10^8$ atoms/$cm^2$. It is also desirable to reduce other metal contaminants such as Al, Mn, Cr, Cu, and Zn. Among the metal contaminants, Fe reduction is believed to be most critical and Fe contamination may come from different sources in the plasma processing chamber such as any stainless steels used in the chamber. The Fe from aluminum alloy 6061-T6 itself is another major source of contamination in the plasma processing chamber.

Therefore, it is desirable to minimize metal contamination on aluminum substrates used in plasma processing chambers.

SUMMARY

An exemplary embodiment of an aluminum-coated component of a plasma processing chamber comprises a substrate having a surface and a high-purity cold-sprayed aluminum coating over at least a portion of the surface, wherein the aluminum coating can be optionally anodized to form an anodized coating on the cold-sprayed aluminum coating. The cold-sprayed aluminum coating can be smoothened to have a surface roughness, Ra, of about 10 to 20 microinches (0.254-0.508 μm) and the cold-sprayed aluminum coating comprises at least 99.99 wt. % Al. The component may be selected from the group consisting of a chamber liner, an electrostatic chuck, a focus ring, a chamber wall, an edge ring, a plasma confinement ring, a substrate support, a baffle, a gas distribution plate, a gas distribution ring, a gas nozzle, a heating element, a plasma screen, a transport mechanism, a gas supply system, a lift mechanism, a load lock, a door mechanism, a robotic arm and a fastener.

The cold sprayed aluminum coating preferably has a thickness of about 2 to 250 mils and an anodized coating with a thickness of about 2 to 125 mils.

An exemplary embodiment of an aluminum-coated component of a plasma processing chamber comprises a substrate having a surface, a cold-sprayed aluminum coating over at least a portion of the surface and an anodized coating over at least a portion of the cold-sprayed aluminum coating.

An exemplary embodiment of a method of plasma processing a semiconductor substrate in a plasma processing chamber comprising the cold-sprayed aluminum coated component comprises supplying at least one process gas from a process gas source into the plasma processing chamber, applying RF energy to the process gas using the RF energy source to generate plasma in the plasma processing chamber, and plasma processing a semiconductor material, insulator or metallic material on a substrate in the plasma processing chamber.

An exemplary embodiment of a method of making the cold-sprayed aluminum coated component comprises cold-spraying an aluminum coating onto at least a portion of the component of the plasma processing chamber. The method of making may further comprise at least one of smoothening the aluminum coating or anodizing the aluminum coating; and optionally may also comprise wet cleaning the component with a cleaning solution after the smoothening and/or anodizing.

DETAILED DESCRIPTION

Components of semiconductor material processing apparatuses, methods of making the components, and methods of processing semiconductor materials in processing chambers including one or more of the components are described herein. The components comprise a corrosion-resistant outer surface that resists wear when the components are used in a plasma processing chamber of a semiconductor material processing apparatus. As used herein, the term "corrosion-resistant" includes resistance to physical and/or chemical attack, such as can be caused by corrosion, erosion and/or corrosion-erosion of process-exposed surfaces.

The components comprise a substrate and a corrosion-resistant coating on at least one surface of the substrate. The substrate "surface" that is coated can be an exterior surface, or an interior surface that defines a hole, cavity or aperture. The coating can be applied on one or more, or on all, exterior surfaces of the components. The corrosion-resistant coatings can cover the entire exterior surface of components. The coatings can also be applied on one or more, or on all, accessible interior surfaces of the components.

The corrosion-resistant coatings comprise a high-purity aluminum coating. In some embodiments, the high-purity aluminum coating comprises a process-exposed surface of the component. In other embodiments, an anodized layer is formed on the high-purity aluminum coating and comprises a process-exposed surface of the component.

Anodized aluminum substrates have been used in plasma processing chambers to provide corrosion resistance against aggressive gases under plasma. Although Al5XXX and Al6XXX can provide a good quality anodized aluminum surface, defects and secondary phases in the anodized surface can cause degradation of the anodized surface and decrease corrosion resistance against aggressive gases under plasma. Moreover, such degradation may facilitate leaching of metal contaminants from the aluminum substrate or from the anodized aluminum surface. To minimize such leaching of metal contaminants from anodized aluminum substrates, it has been found that surface modification of an aluminum substrate prior to anodization is beneficial. For example, surface modification of an aluminum substrate by cold-spraying prior to anodization is beneficial.

Figure 1:
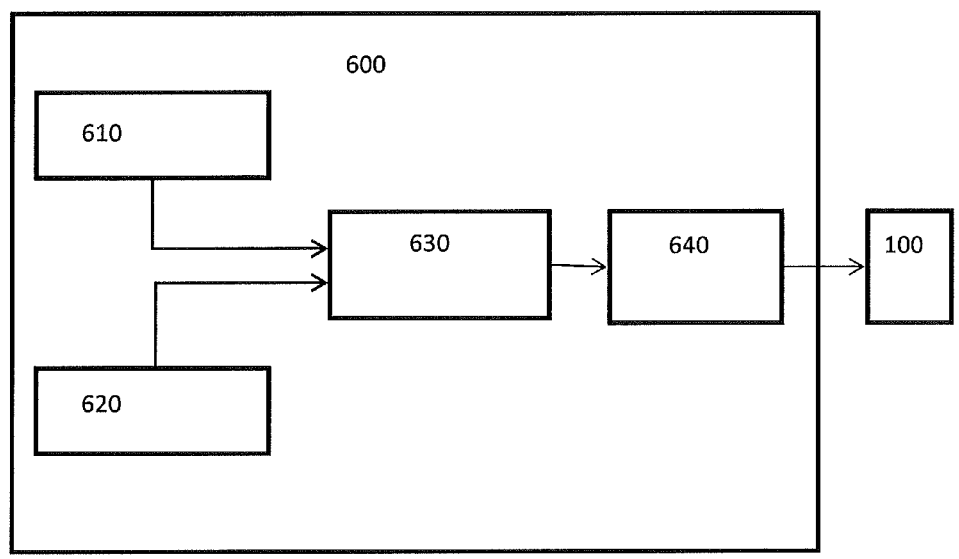
FIG. 1 is a schematic view of a cold-spraying apparatus.

Cold-spray methods are described in US Published Patent Application No. 2006/0093736, hereby incorporated by reference in its entirety. Briefly, and as shown in FIG. 1, cold-spray system 600 is illustrated diagrammatically. The system 600 is illustrated as a general scheme, and additional features and components can be implemented into the system 600 as necessary. The main components of cold-spray system 600 include a powder feeder 610 for providing powder materials, a carrier gas supply 620 for heating and accelerating powder materials at temperatures of about 300° C. to 400° C., a mixing chamber 630 and a supersonic nozzle 640. In general, the system 600 transports the metal powder mixtures with a suitable pressurized gas to mixing chamber 630. The particles are accelerated by the pressurized carrier gas such as air, helium or nitrogen, through supersonic nozzle 640 and directed toward plasma processing chamber component 100. Due to particle expansion in the nozzle, the particles return approximately to ambient temperature when they impact with the target surface. When the particles strike the target surface at supersonic speeds, converted kinetic energy causes plastic deformation of the particles, which in turn causes the particles to form a bond with the target surface. Thus, cold-spray system 600 can bond the powder materials to a component surface and thereby strengthen and protect the component. The cold-spray process is referred to as a "cold gas" process because the particles are mixed and applied at a temperature that is well below their melting point. The kinetic energy of the particles on impact with the target surface, rather than particle temperature, causes the particles to plastically deform and bond with the target surface. Therefore, bonding to the component surface takes place as a solid state process with insufficient thermal energy to transition the solid powders to molten droplets.

Such methods have been found to deposit a dense, highly-pure Al coating on Al alloys to impede the leaching of impurity from the base Al alloys. Subsequent high-quality anodization of the pure Al coating further enhance the corrosion resistance of the pure Al coating. The advantages of cold-spray methods make such methods production-worthy and are described below.

Cold-spray methods can lead to a porosity-free and highly adherent Al coating. Cold-spraying utilizes supersonic kinetic energy of Al particles due to expansion of the gas to impinge a substrate, and produce a dense coating with good adhering strength without melting of the Al particles. It is believed that when a spherical Al particle traveling at a critical velocity impacts a substrate, a strong pressure field propagates spherically into the particle and substrate from the point of contact inducing a shear load which accelerates the material laterally and causes localized shear straining. Such shear loading may lead to adiabatic shear instability where thermal softening is locally dominant over work strain and strain rate hardening promoting viscous flow of material in an outward direction with temperatures close to the melting point of the Al material. Such a high-quality pure Al coating is essential to the quality of subsequent anodization.

Cold-spray methods can produce machinable coatings. Cold-spraying can be successfully employed as a cost effective method to coat a thick pure metal on a much cheaper base material to fabricate chamber components. The thick coating not only establishes a superior impurity or gas diffusion barrier, but also makes the post-machining of the coating possible. By machining/polishing the cold-spray pure Al to a desired surface roughness, Ra, both anodization quality and surface cleanness can be readily ensured.

Cold-spray methods can operate at low temperatures. Cold-spraying operates at much lower substrate temperatures (typically 30° C.~40° C. above room temperature) as compared with thermal spray methods. Therefore, Al part deformation (e.g., creep) during cold-spraying is minimized if not eliminated. Furthermore, a low substrate temperature prevents the migration of impurities due to thermal diffusion from the base material to contaminate the pure cold-sprayed Al coating which otherwise nullifies the coating efforts.

Cold-spray methods are versatile. Cold-spraying can coat a wide range of materials including Al alloys (e.g., Al 6061T6, Al5052, Al thickness block, Casting Al et al), stainless steel, ceramics and even high-T polymers. This makes surface modifications of various substrate materials possible. Moreover, the composition of coating can be easily tailored for anodization. For example, it is generally believed that a certain amount of Mg in the Al is beneficial for Al anodization. Therefore, Mg powder can be pre-blended into pure Al powders for cold-spray coatings with improved anodization quality, as Mg is typically not a critical metal contaminating element.

Cold-spray methods are readily scaled up. Cold-spraying is easier for large coatings and simply re-programming the robotics of the cold spray gun can lead to the scale-up. The cost associated with the scale-up is conceivably much less than other surface modification methods (e.g., electroplating) where the plating tank size/power supply/facility accessories have to be enlarged to accommodate the size of parts, leading to significantly higher cost.

Cold-sprayed coatings can be machined to any surface finish before anodization, which is critical to achieve a corrosion resistance anodization layer and longer part lifetimes. Cold-spray methods also demonstrate thermal cycling resistance. Since cold-spraying can produce centimeters thick layers on Al alloys, only pure cold-sprayed Al is exposed to plasma after thermal cycling and the diffusion of Fe and other elements through cold sprayed coatings at relatively low temperature (<180° C.) is very difficult. Cold-sprayed coatings of up to 10 mils (≤250 μm), up to 15 mils (≤380 μm), up to 20 mils (≤500 μm), and even up to 1.0 cm can maintain the same mechanical properties as the aluminum alloys they are deposited on since the cold-sprayed coatings is a "skin" when compared to the thickness of the aluminum alloys they are deposited on.

Figure 2:
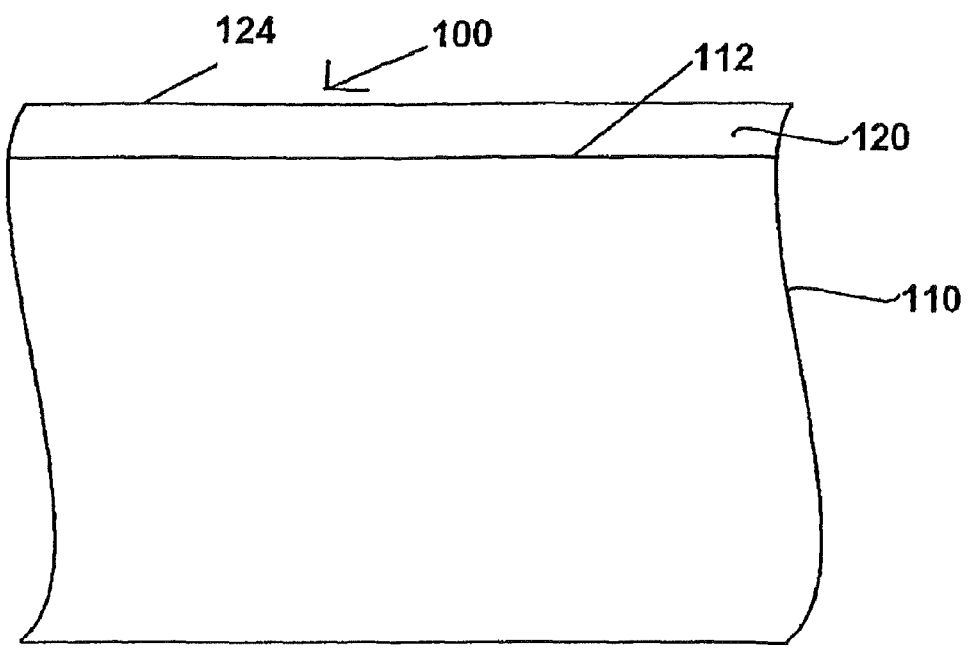
FIG. 2 illustrates an exemplary embodiment of a plasma processing chamber component comprising a substrate and a high-purity corrosion-resistant coating on a surface of the substrate.

A component 100 according to an exemplary embodiment is shown in FIG. 2. As shown, the component 100 comprises a substrate 110 including a surface 112 and a corrosion-resistant coating 120 formed on the surface 112. In the embodiment, the corrosion-resistant coating 120 is a cold-sprayed high-purity aluminum coating comprising an outer surface 124 of the component 100. The substrate 110 comprises an electrically-conductive material. The electrically-conductive material can be a metallic material (i.e., a pure metal or an alloy); or a non-metallic material that has sufficient electrical conductivity, such as graphite, an electrically-conductive ceramic material, or an electrically-conductive polymeric material. Exemplary metals that can used to form the substrate 110 include steels (e.g., stainless steels); aluminum and aluminum alloys (e.g., Al6061-T6); refractory metals, such as hafnium, zirconium, titanium, niobium, tungsten, molybdenum, and alloys thereof; transition metals, such as nickel, iron, cobalt, and alloys thereof; and other metallic materials. Preferably, the substrate 110 comprises aluminum or an aluminum alloy, such as Al6061-T6.

In the exemplary component 100, the cold-sprayed high-purity aluminum coating forming the corrosion-resistant coating 120 is a high-purity material. Preferably, the cold-sprayed high-purity aluminum coating comprises at least about 99.00 wt. % aluminum, at least about 99.7 wt. % aluminum, more preferably at least about 99.98 wt. % aluminum, such as >99.999 wt. % aluminum. The cold-sprayed high-purity aluminum coating can comprise, in ppm, one or more of the following elements: ≤50 ppm Mn, ≤300 ppm Si, ≤75 ppm Ni, ≤25 ppm Cr, ≤50 ppm Cu, ≤100 ppm V, ≤800 ppm Fe, ≤25 ppm Mg, ≤50 ppm Zn, ≤50 ppm Ti, ≤10 ppm B, ≤10 ppm Pb, ≤40 ppm Zr, ≤25 ppm Bi, ≤25 ppm Sn and ≤25 ppm Ca. More preferably, the cold-sprayed high-purity aluminum coating can comprise, in ppm, one or more of the following elements: ≤25 ppm Mn, ≤50 ppm Si, ≤50 ppm Ni, ≤15 ppm Cr, ≤25 ppm Cu, ≤25 ppm V, ≤50 ppm Fe, ≤10 ppm Mg, ≤25 ppm Zn, ≤25 ppm Ti, ≤5 ppm B, ≤5 ppm Pb, ≤20 ppm Zr, ≤10 ppm Bi, ≤10 ppm Sn and ≤10 ppm Ca. Accordingly, the aluminum coating can have a very low total transition metal content, e.g., ≤1000 ppm, ≤500 ppm, ≤250 ppm or less than ≤100 ppm by weight of the coating. Most preferably, the cold-sprayed aluminum coating comprises 100 ppm or less of each of Mn, Si, Ni, Cr, Cu, V, Fe, Mg, Zn, Ti, B, Pb, Zr, Bi, Sn and Ca. Consequently, the aluminum coating can at least substantially reduce transition metal contamination of semiconductor material processing chambers containing one or more of the components.

Figure 3:
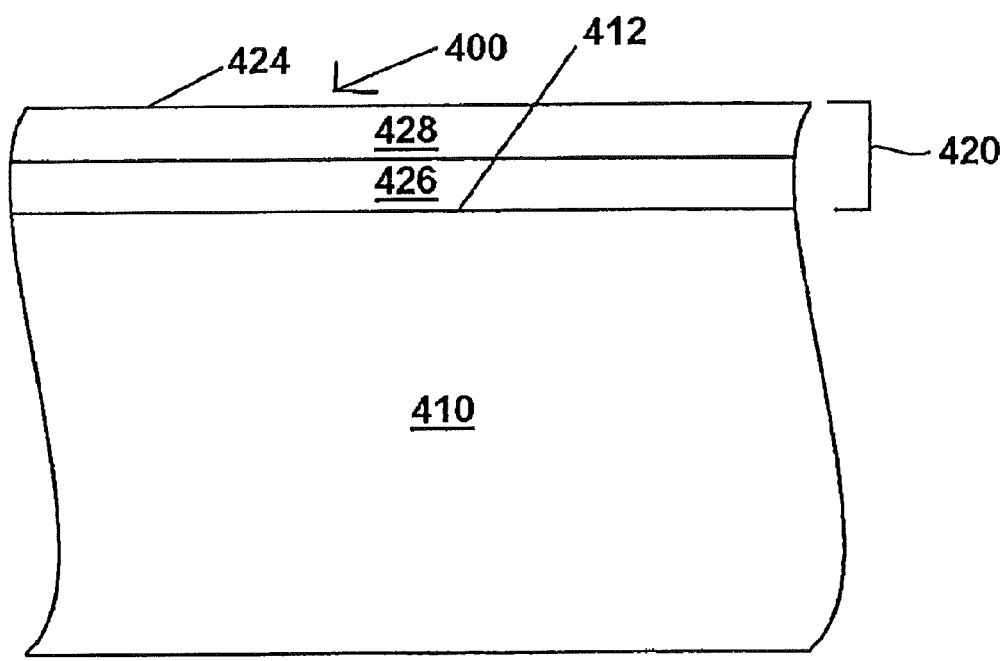
FIG. 3 illustrates another exemplary embodiment of a plasma processing chamber component comprising a substrate, a high-purity corrosion-resistant coating on a surface of the substrate and an anodized layer on the high-purity corrosion-resistant coating.
Figure 4:
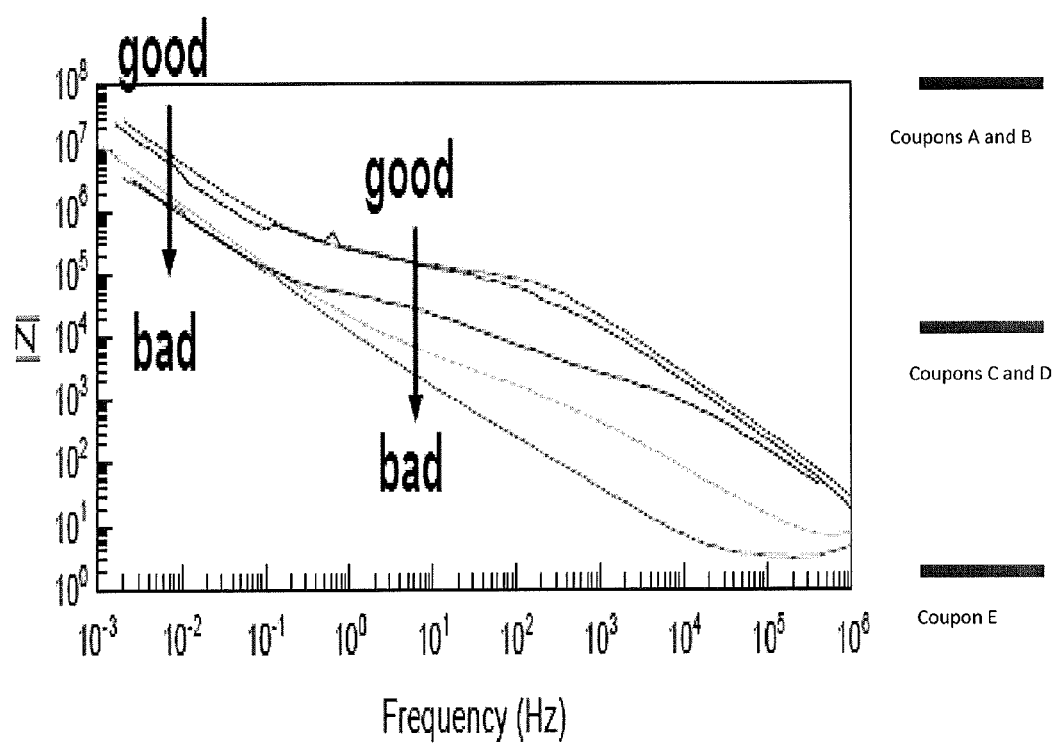
FIG. 4 shows the results of electrochemical impedance spectroscopy (EIS) testing components comprising the high-purity corrosion-resistant coatings.

FIG. 3 illustrates a component 400 according to another exemplary embodiment that can be used in a plasma etch chamber or material deposition chamber, for example. In the embodiment, the component 400 comprises a substrate 410 and a corrosion-resistant coating 420 formed on the substrate 410. The corrosion-resistant coating 420 comprises a cold-sprayed high-purity aluminum coating 426 formed on the surface 412 of the substrate 410, and an anodized layer 428 formed on the cold-sprayed high-purity aluminum coating 426 and comprising an outer surface 424 of the component 400. The anodized layer 428 provides resistance to chemical and/or physical attack by plasma and/or corrosive gases (e.g., HBr and Cl) in plasma etch chambers and material deposition chambers.

In the embodiment, the substrate 410 on which the cold-sprayed high-purity aluminum coating 426 is formed can comprise an electrically-conductive material (such as the substrate 110 shown in FIG. 1). The electrically-conductive material can be a metallic material (i.e., a pure metal or an alloy); or a non-metallic material that has sufficient electrical conductivity, such as graphite, an electrically-conductive ceramic material, or an electrically-conductive polymeric material. Exemplary metals that can used to form the substrate 410 include steels (e.g., stainless steels); aluminum and aluminum alloys (e.g., Al6061-T6); refractory metals, such as hafnium, zirconium, titanium, niobium, tungsten, molybdenum, and alloys thereof; transition metals, such as nickel, iron, cobalt, and alloys thereof; and other metallic materials. Preferably, the substrate 410 comprises aluminum or an aluminum alloy, such as Al6061-T6.

In the exemplary component 400, the cold-sprayed high-purity aluminum coating forming the corrosion-resistant coating 420 is a high-purity material. Preferably, the cold-sprayed high-purity aluminum coating comprises at least about 99.00 wt. % aluminum, at least about 99.7 wt. % aluminum, more preferably at least about 99.98 wt. % aluminum, such as >99.999 wt. % aluminum. The cold-sprayed high-purity aluminum coating can comprise, in ppm, one or more of the following elements: ≤50 ppm Mn, ≤300 ppm Si, ≤75 ppm Ni, ≤25 ppm Cr, ≤50 ppm Cu, ≤100 ppm V, ≤800 ppm Fe, ≤25 ppm Mg, ≤50 ppm Zn, ≤50 ppm Ti, ≤10 ppm B, ≤10 ppm Pb, ≤40 ppm Zr, ≤25 ppm Bi, ≤25 ppm Sn and ≤25 ppm Ca. More preferably, the cold-sprayed high-purity aluminum coating can comprise, in ppm, one or more of the following elements: ≤25 ppm Mn, ≤50 ppm Si, ≤50 ppm Ni, ≤15 ppm Cr, ≤25 ppm Cu, ≤25 ppm V, ≤50 ppm Fe, ≤10 ppm Mg, ≤25 ppm Zn, ≤25 ppm Ti, ≤5 ppm B, ≤5 ppm Pb, ≤20 ppm Zr, ≤10 ppm Bi, ≤10 ppm Sn and ≤10 ppm Ca. Accordingly, the aluminum coating can have a very low total transition metal content, e.g., ≤1000 ppm, ≤500 ppm, ≤250 ppm or less than ≤100 ppm by weight of the coating. Most preferably, the cold-sprayed aluminum coating comprises 100 ppm or less of each of Mn, Si, Ni, Cr, Cu, V, Fe, Mg, Zn, Ti, B, Pb, Zr, Bi, Sn and Ca. Consequently, the aluminum coating can at least substantially reduce transition metal contamination of semiconductor material processing chambers containing one or more of the components.

The anodized layer 428 can be formed on the cold-sprayed high-purity aluminum coating 426 by any suitable anodizing process. For example, mixed acid and hard anodizing processes can be used. The as-formed anodized layer is porous. Preferably, fluid-accessible pores of the anodized layer 428 are sealed by exposing the anodized surface to hot water or steam, for example, to form AlOOH. The anodized layer 428 preferably has a thickness of less than about 50 mils, such as less than about 40 mils, less than about 30 mils, less than about 20 mils, less than about 10 mils or less than about 5 mils. During anodizing of the cold-sprayed high-purity aluminum coating 426, the anodized layer 428 grows from and into the cold-sprayed high-purity aluminum coating 426. The cold-sprayed high-purity aluminum coating 426 is formed on the substrate 410 with a sufficient thickness to allow formation of the anodized layer with a desired thickness. Preferably, the cold-sprayed high-purity aluminum coating 426 is formed on the substrate 410 with a thickness that is at least about twice the desired thickness of the anodized layer 428.

By forming the anodized layer 428 on the cold-sprayed high-purity aluminum coating 426, the corrosion-resistant coating 420 can be used in etch chambers and exposed to gases and/or plasma that could chemically or physically attack the cold-sprayed high-purity aluminum coating 426 if the cold-sprayed high-purity aluminum coating 426 comprised a process-exposed surface. When the component 400 is used in such etch chambers, because the cold-sprayed high-purity aluminum coating 426 can be deposited with minimal impurities, such as transition metals, which are detrimental to the performance and lifetimes of electronic devices manufactured on semiconductor wafers, the contamination of processing chambers and wafers by impurities during wafer processing can be substantially eliminated.

Embodiments of the corrosion-resistant coatings comprising a cold-sprayed high-purity aluminum coating comprising a process-exposed surface, and embodiments of the coatings comprising anodized aluminum comprising a process-exposed surface can be formed on metallic substrates that have a transition metal content that may be higher than a maximum acceptable content for a process-exposed surface. The corrosion resistant coatings can substantially prevent the transition metals from being removed from the substrate by corrosive gases, plasma and/or energetic ions and consequently contaminating a process chamber. For example, the cold-sprayed high-purity aluminum coating can be formed on non-aluminum metallic surfaces, such as steel and stainless steel surfaces. The aluminum plating can also be formed on aluminum surfaces, and is preferably formed on an AL6061-T6 surface. Forming the corrosion-resistant coatings on one or more surfaces of an AL6061-T6 aluminum substrate, e.g., allows easier machining and forming of component shapes, and use of the cold-sprayed high-purity aluminum coating minimizes the potential for transition metal contamination of processed wafers.

As described above, in embodiments of the components comprising a cold-sprayed high-purity aluminum coating and an anodized layer formed on the cold-sprayed high-purity aluminum coating, the anodized layer provides one or more surfaces that can resist chemical and physical attack and associated levels of particulate contamination in plasma reactor chambers, including deposition and etch chambers. The anodized layer can also protect underlying substrates against both physical attack and chemical attack by plasmas and corrosive gases in such reactor chambers.

The cold-sprayed high-purity aluminum coated components including an anodized layer comprising a process-exposed surface can be used in various plasma atmospheres for etching, deposition, cleaning, and other applications. Typical etch chemistries can include, e.g., chlorine-containing gases, such as $Cl_2$, HCl and $BCl_3$; bromine-containing gases, such as $Br_2$ and HBr; oxygen-containing gases, such as $O_2$, $H_2O$ and $SO_2$; fluorine-containing gases, such as $CF_4$, $CH_2F_2$, $NF_3$, $CH_3F$, $C_2F_6$, $CHF_3$ and $SF_6$; and inert and other gases, such as He, Ar and $N_2$. These and other gases may be used in any suitable combination, depending on the desired plasma. Suitable flow rates of the various process gases can be selected based on factors including, but not limited to, the type of plasma reactor, power settings, chamber pressure, plasma dissociation rates, etch chemistries, materials to be etched, and the particular step of the etch process in which the process gas is used.

The cold-sprayed high-purity aluminum coated components including an anodized surface comprising a process-exposed surface can be used in etch chambers of semiconductor processing equipment for etching conductors, semiconductors and/or insulators and for process chamber cleaning, conditioning, deposition of materials (e.g., CVD, PVD, PECVD and the like), resist stripping processes (e.g., using an upstream plasma source) used for manufacturing various substrates including, e.g., semiconductor wafers, flat panel display substrates and the like, or degas chambers. Depending on the type and construction of an apparatus, the parts can be, e.g., chamber walls, chamber liners, substrate supports, baffles (e.g., provided in showerhead electrode assemblies above the showerhead electrode), gas distribution plates, gas distribution rings, chucking mechanisms (e.g., electrostatic chucks), focus rings for substrate supports, gas nozzles, fasteners, heating elements, plasma screens and the like. The components can include one or more exterior and/or interior surfaces coated with a corrosion-resistant coating. In some embodiments, the entire exterior surface of components can be coated or only a portion of the component can be coated.

The cold-sprayed high-purity aluminum coated components including an anodized layer comprising a process-exposed surface can be used as reactor components in a polysilicon high-density plasma reactor, for example. An exemplary reactor of this type is the TCP 9400™. plasma etch reactor available from Lam Research Corporation of Fremont, Calif. In this reactor, processing gases (e.g., $Cl_2$, HBr, $CF_4$, $CH_2F_2$, $O_2$, $N_2$, Ar, $SF_6$ and $NF_3$) are supplied into the reactor chamber.

Another exemplary polysilicon etch reactor is the VersyS™ Polysilicon Etcher or 2300™ etcher, which is also available from Lam Research Corporation of Fremont, Calif. The polysilicon etch reactor includes a substrate support having an electrostatic chuck, and a plasma focus ring is mounted on the substrate support around the electrostatic chuck. The substrate support can also be used to apply an RF bias to the substrate. The substrate can be back-cooled using a heat transfer gas. In the 2300™ etcher, processing gases (e.g., $Cl_2$, HBr, $CF_4$, $CH_2F_2$, $O_2$, $N_2$, Ar, $SF_6$ and $NF_3$) are introduced into the chamber via a gas injector. An inductive coil proximate a dielectric window of the chamber can be powered by a suitable RF source to provide a high-density plasma inside the chamber. A chamber liner surrounds the substrate support, and the chamber can also include suitable vacuum pumping apparatus for maintaining the interior of the chamber at a desired pressure.

Certain reactor components, such as portions of the substrate support, the chamber liner, the focus ring, and/or the electrostatic chuck, can be cold-sprayed high-purity aluminum coated components and have anodized layers comprising a process-exposed surface. The wall of the chamber and the substrate support below the chamber liner can also be cold-sprayed high-purity aluminum coated components including an anodized layer. Any or all of these components, as well as any other components having a process-exposed surface, can be cold-sprayed high-purity aluminum coated components including an anodized layer.

The reactor components can also be used in a high-density oxide etch process. An exemplary oxide etch reactor is the TCP9100™ plasma etch reactor available from Lam Research Corporation of Fremont, Calif. In the TCP™ reactor, the gas distribution plate is situated directly below the TCP™ window, which is also the vacuum sealing surface at the top of the reactor in a plane above and parallel to a substrate being processed. Process gas is fed from a source into the space defined by the gas distribution plate, an inside surface of the window underlying a flat spiral coil supplying RF energy into the reactor. The gas distribution plate material comprises a dielectric material to enable coupling of this RF power through the gas distribution plate into the reactor.

The oxide etch reactor comprises a plasma chamber that includes a substrate holder having an electrostatic chuck, which provides a clamping force to a substrate and an RF bias to a substrate. The substrate can be back-cooled using a heat transfer gas. A focus ring confines plasma in an area above the substrate. A source of energy for maintaining a high density (e.g., $10^{11}$-$10^{12}$ ions/cm$^3$) plasma in the chamber, such as an antenna powered by a suitable RF source to provide a high density plasma, is disposed at the top of the plasma chamber. The chamber includes suitable vacuum pumping apparatus for maintaining the interior of the chamber at a desired pressure (e.g., below 50 mTorr, typically 1-20 mTorr).

A substantially planar dielectric window is provided between the antenna and the interior of the plasma processing chamber and forms a vacuum wall at the top of the processing chamber. A gas distribution plate is beneath window and includes openings for delivering process gas from the gas supply to the chamber. A conical or cylindrical liner extends from the gas distribution plate and surrounds the substrate holder. The antenna can optionally be provided with a channel through which a heat transfer fluid is circulated via inlet and outlet conduit.

In operation, a semiconductor substrate, such as a silicon wafer, is positioned on the substrate holder and held in place by an electrostatic chuck. Process gas is supplied to the vacuum processing chamber, and a high-density plasma is generated in the space between the substrate and the window by supplying RF power to the antenna.

Various reactor components, such as the chamber liner, the electrostatic chuck, and the focus ring can be cold-sprayed high-purity aluminum coated components having an exposed anodized layer.

The high-density polysilicon and dielectric etch chambers described above are only exemplary plasma etch reactors that can incorporate cold-sprayed high-purity aluminum coated components having an anodized layer. The components can be used in any etch reactor (e.g., a metal etch reactor), or other type of semi-conductor processing equipment where plasma erosion is a problem.

Other cold-sprayed high-purity aluminum coated components having an anodized layer can be chamber walls, substrate holders, fasteners, and the like. These parts are typically made from metal (e.g., aluminum) or ceramic (e.g., alumina) and are typically exposed to plasma. Other components may not be directly exposed to plasma, but are exposed to corrosive gases, such as gases emitted from processed wafers or the like. Other equipment used in processing semiconductor substrates can also be aluminum-plated components having an anodized layer. Such equipment can include transport mechanisms, gas supply systems, liners, lift mechanisms, load locks, door mechanisms, robotic arms, fasteners, and the like.

Methods of plasma processing a semiconductor substrate in a plasma processing chamber comprising the cold-sprayed aluminum coated component comprises supplying at least one process gas from a process gas source into the plasma processing chamber, applying RF energy to the process gas using the RF energy source to generate plasma in the plasma processing chamber, and plasma processing a semiconductor material, insulator or metallic material on a substrate in the plasma processing chamber. The plasma processing may comprise an etching process, a cleaning process, a deposition process, a resist-stripping process or a degas process. Process gases to be supplied to the plasma processing chamber comprise at least one of $Cl_2$, HCl, $BCl_3$, $Br_2$, HBr, $O_2$, $H_2O$, $SO_2$, $CF_4$, $CH_2F_2$, $NF_3$, $CH_3F$, $C_2F_6$, $CHF_3$ and $SF_6$.

Methods of making the cold-sprayed high-purity aluminum coated components comprises cold-spraying an aluminum coating onto at least a portion of the component of the plasma processing chamber. The method of making may further comprise at least one of smoothening the aluminum coating or anodizing the aluminum coating; and optionally wet cleaning the component with a cleaning solution after the smoothening and/or anodizing. Wet cleaning of the coated components can be accomplished by any number of known methods, such as those described in commonly-assigned U.S. Published Patent Application 2011/0146704 and U.S. Pat. No. 7,507,670, both of which are hereby incorporated by reference in their entireties.

EXAMPLES

Example 1

Each of coupons A-E comprised an Al6061-T6 aluminum substrate having a cold-sprayed high-purity aluminum coating comprising at least 99.7% by weight Al. The coupons were anodized using three different anodization processes I, II and III. An aluminum coating having a thickness of about 5 mils was cold-sprayed on each of coupons A, B, C, D and E. Coupons A-E had an anodized layer thickness in the range of about 1.5-about 3.0 mils. Coupons A and B were anodized using the anodization process I. Coupons C and D were anodized using the anodization process II. Coupon E was anodized using the anodization process III. Each of the coupons was also smoothened prior to anodization using standard chemical-mechanical polishing techniques.

The anodization process I included the steps of pre-cleaning, deoxidizing, masking, demutting, anodic anodization, post cleaning, hot deionized water sealing, final cleaning, drying and packaging steps. A sulfuric acid bath was used.

The anodization process II included use of an oxalic acid bath.

The anodization process III included use of both oxalic and sulfuric acid (i.e., a mixed acid) in the anodization tank. This process utilizes benefits of oxalic acid (e.g., high ending voltage, but low electrical conductivity) and sulfuric acid (e.g., high conductivity, removes intermetallic particles, use of low temperature to achieve good hardness).

As shown in Table 1, the coupons were tested to determine the breakdown voltage of the anodized films. Coupons C, D and E have average breakdown voltages of over 1.2 kV and coupons A and B have average breakdown voltages of below 1.2 kV.

TABLE 1

| | Breakdown Voltage [kV] | | | | | |
|---|---|---|---|---|---|---|
| A | 0.99 | 0.99 | 1.03 | 1.13 | 1.29 | 0.97 |
| B | 0.84 | 1.1 | 1.22 | 1.2 | 0.84 | 0.83 |
| C | 1.45 | 1.6 | 1.11 | 1.49 | 1.6 | 1.54 |
| D | 1.6 | 1.57 | 1.6 | 1.56 | 1.145 | 1.49 |
| E | 1.09 | 1.19 | 1.29 | 1.11 | 1.09 | 1.39 |

As shown in Table 2, the anodized layer thickness was measured for the coupons. Coupons A, B, C and D each had a mean thickness of at least 2 mils (about 50 µm). Coupon E had the lowest anodized layer mean thickness of about 1.778 mils.

TABLE 2

| | Anodized Layer Thickness [mil] | | | | | |
|---|---|---|---|---|---|---|
| | Mean | Min | Max | Standard | Range | Variation |
| A | 2.121 | 1.962 | 2.287 | 0.086 | 0.324 | 4.08% |
| B | 2.097 | 1.962 | 2.191 | 0.068 | 0.229 | 3.23% |
| C | 2.023 | 1.863 | 2.176 | 0.098 | 0.313 | 4.83% |
| D | 2.893 | 2.77 | 2.982 | 0.066 | 0.212 | 2.29% |
| E | 1.778 | 1.612 | 1.921 | 0.089 | 0.31 | 5.02% |

As shown in Table 3, the surface roughness of the anodized layers was measured. For each coupon, arithmetic mean surface roughness measurements were made at six locations on the anodized surface. The surface roughness values for the coupons were similar.

TABLE 3

Anodized Layer Roughness (micro-inches)

| A | 131 | 127 | 126 | 126 | 129 | 120 |
|---|---|---|---|---|---|---|
| B | 119 | 112 | 123 | 118 | 121 | 123 |
| C | 117 | 128 | 115 | 115 | 109 | 121 |
| D | 119 | 109 | 106 | 112 | 113 | 107 |
| E | 128 | 113 | 120 | 118 | 110 | 121 |

The coupons were also tested using the HCl bubble test. To perform the bubble test, epoxy was used to mount a poly-glass tube on the anodization of the coupons. After drying, a 5 wt. % HCl solution was filled in the tube. The anodized surface was observed for the appearance of continuous $H_2$ bubble generation from the anodized surface. In the bubble test, when the anodization fails, HCl directly reacts with aluminum to generate $H_2$ bubbles. The time until continuous $H_2$ bubble generation was determined. Each of the coupons did not generate continuous $H_2$ bubbles within 5 hours of testing. Table 4 shows results of admittance and HCl bubble tests for Coupons A-E.

TABLE 4

| Coupon | Admittance Mode I (ratio) | | | Mode II (s) | | | HCl (hour) | |
|---|---|---|---|---|---|---|---|---|
| A | 0.76 | 0.68 | 0.68 | 12 | 12 | 12 | >5 | >5 |
| B | 0.78 | 0.8 | 0.8 | 11 | 12 | 9 | >5 | >5 |
| C | 0.27 | 0.27 | 0.27 | 0 | 0 | 0 | >5 | >5 |
| D | 0.34 | 0.35 | 0.35 | 0 | 0 | 0 | >5 | >5 |
| E | 0.28 | 0.3 | 0.2 | 5 | 5 | 20 | >5 | >5 |

The coupons A-E were also subjected to electrochemical impedance spectroscopy (EIS) testing using a 3.5 wt. % NaCl solution, which is equivalent to sea water, as shown in FIG. 3. Coupons C, D and E displayed excellent corrosion resistance, with coupon E showing the best corrosion resistance (highest impedance, Z) according to this testing, and coupons C and D the second highest impedance, Z.

Example 2

Each of coupons F, G, H and I comprised an Al6061-T6 aluminum substrate having a cold-sprayed high-purity aluminum coating comprising at least 99.7% by weight Al. The coupons were anodized using three different anodization processes I, II and III. An aluminum coating having a thickness of about 5 mils was cold-sprayed on each of coupons F-I. Coupons F-I had an anodized layer thickness in the range of about 2.2-about 2.4 mils. Coupons F and G were anodized using the anodization process I as described in the above example. Coupon H was anodized using the anodization process III as described in the above example. Coupon I was anodized using the anodization process II as described in the above example. Each of the coupons was also smoothened prior to anodization using standard chemical-mechanical polishing techniques.

Table 5 shows the thickness, surface roughness, breakdown voltage, admittance, HCl bubble time and visual appearance of coupons F-I.

TABLE 5

| Coupon | Thickness (mil) | Roughness (Ra) | Breakdown Voltage (kV/mil) | Admittance (μS) | HCl Bubble Time (Hr) | Visual Appearance |
|---|---|---|---|---|---|---|
| F | 2.42 | 75 | 0.19 | 100 | 45 min. | Black, surface pitting |
| G | 2.28 | 29 | 0.40 | 35 | ≥2 | Smooth, dark bluish |
| H | 2.43 | 11 | 0.49 | 6 | ≥2 | Smooth, Greenish |
| I | 2.25 | 7 | 0.49 | 10 | ≥2 | Smooth, Greenish |

Coupons G, H and I have average breakdown voltages of at least 0.4 kV/mil and coupon F has an average breakdown voltages of below 0.2 kV/mil. Coupons F-I each had a mean thickness of at least 2.25 mils (about 56 μm). Coupons G and I had the lowest anodized layer mean thicknesses of about 2.28 mils and 2.25 mils, respectively. For each coupon, arithmetic mean surface roughness measurements were made at six locations on the anodized surface. The surface roughness values for the coupons were not similar. The coupons were also tested using the HCl bubble test, as described in the above example. Coupons G-I did not generate continuous $H_2$ bubbles within 2 hours of testing. Coupon F generated $H_2$ bubbles within 2 hours of testing.

Figure 5:
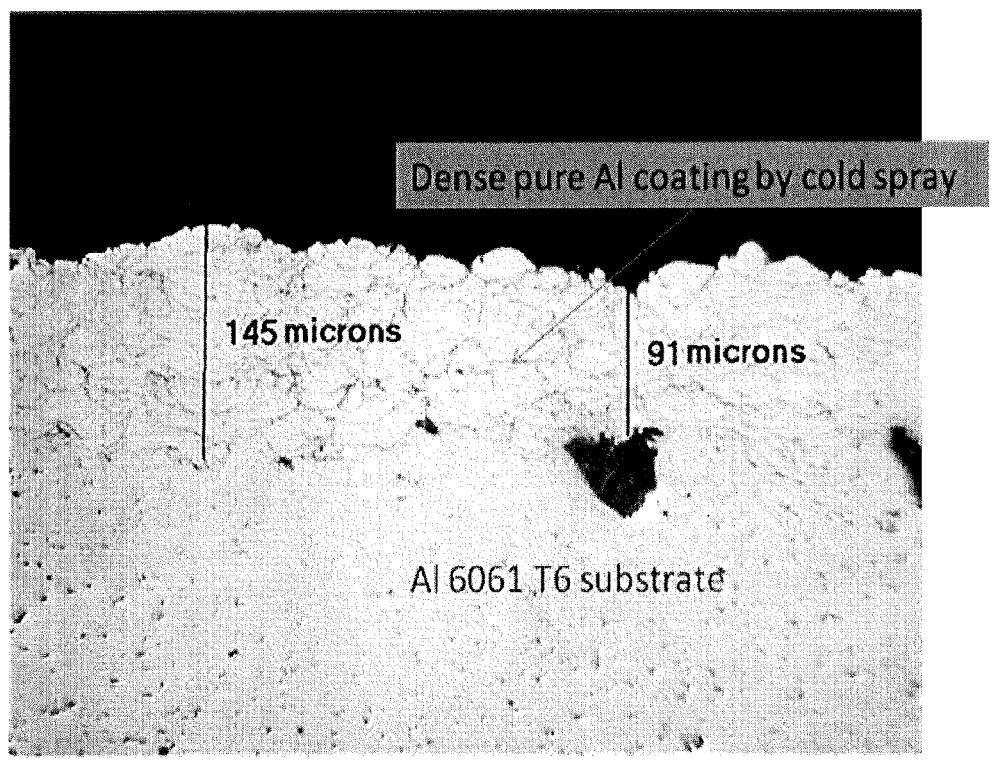
FIG. 5 shows an SEM photograph of a component comprising the high-purity corrosion-resistant coating.

From the above examples of a cold-sprayed aluminum coating on Al6061-T6, a very dense, high-purity Al coating can be realized. FIG. 5 shows a cross-section of an SEM photograph for coupon E prior to anodization. As can be seen, the cold-sprayed Al coating is dense and substantially free of pores. Such a high-purity Al coating can be easily machined to a surface roughness of Ra<16 microinches. The purity level is much higher than Al 6061 base materials, with over a 100× reduction of impurity elements, such as iron. Based on above results, cold-spraying can substantially reduce Fe and Cr contamination from the source, maintain excellent corrosion resistance (HCl bubble time and EIS), and provide different anodization methods based on the need. For example, the results show that anodization process I can keep dark color with relative low breakdown voltage (750V) and excellent corrosion resistance, while anodization processes II and III can provide high breakdown voltage greater than 0.6 kV, preferably greater than 1 kV and most preferably greater than 1.2 kV and excellent corrosion resistance with a light color.

Although the present invention has been described in connection with preferred embodiments thereof, it will be appreciated by those skilled in the art that additions, deletions, modifications, and substitutions not specifically described can be made without departing from the spirit and scope of the invention as defined in the appended claims.

What is claimed is:

1. An aluminum-coated component of a plasma processing chamber, the component comprising:
   a substrate having a surface; and
   a cold-sprayed aluminum coating over at least a portion of the surface of the substrate, wherein the cold-sprayed aluminum coating comprises aluminum powder material particles bonded to the surface via plastic deformation of the particles;
   wherein
   the cold-sprayed aluminum coating comprises 100 ppm or less of each of Mn, Si, Ni, Cr, Cu, V, Fe, Mg, Zn, Ti, B, Pb, Zr, Bi, Sn and Ca;

the cold-sprayed aluminum coating has a surface roughness, Ra, of about 10 to 20 microinches (0.254-0.508 µm); and the cold-sprayed aluminum coating has a thickness of at least 15 mils and establishes an impurity or gas diffusion barrier.

2. The component of claim 1, further comprising an anodized coating over at least a portion of the cold-sprayed aluminum coating.

3. The component of claim 1, wherein the cold-sprayed aluminum coating has a thickness of 15 to 250 mils.

4. The component of claim 2, wherein the anodized coating has a thickness of 15 to 125 mils.

5. The component of claim 1, wherein the cold-sprayed aluminum coating comprises at least 99.7 wt. % Al and the substrate comprises AL6061-T6.

6. The component of claim 1, wherein the component is selected from the group consisting of a chamber liner, an electrostatic chuck, a focus ring, a chamber wall, an edge ring, a plasma confinement ring, a substrate support, a baffle, a gas distribution plate, a gas distribution ring, a gas nozzle, a heating element, a plasma screen, a transport mechanism, a gas supply system, a lift mechanism, a load lock, a door mechanism, a robotic arm and a fastener.

7. The component of claim 2, wherein the anodized coating has a breakdown voltage of at least about 1.2 kV and/or the component does not produce hydrogen bubbles from an HCl bubble test for at least 5 hours.

8. The component of claim 2, wherein the cold-sprayed aluminum coating has a thickness of at least about twice that of the anodized coating.

9. An aluminum-coated component of a plasma processing chamber, the component comprising:

a substrate having a surface; and a cold-sprayed aluminum coating over at least a portion of the surface of the substrate, the cold-sprayed aluminum coating having a surface roughness, Ra, of about 10 to 20 microinches (0.254-0.508 µm), wherein the cold-sprayed aluminum coating comprises aluminum powder material particles bonded to the surface via plastic deformation of the particles; and an anodized coating over at least a portion of the cold-sprayed aluminum coating;

wherein the cold-sprayed aluminum coating comprises 100 ppm or less of each of Mn, Si, Ni, Cr, Cu, V, Fe, Mg, Zn, Ti, B, Pb, Zr, Bi, Sn and Ca; and the cold-sprayed aluminum coating has a thickness of at least 15 mils and establishes an impurity or gas diffusion barrier.

10. The component of claim 9, wherein the cold-sprayed aluminum coating comprises at least 99.7 wt. % Al and the substrate comprises AL6061-T6.

11. The component of claim 9, wherein the cold-sprayed aluminum coating and the anodized coating have thicknesses of 15 to 125 mils and wherein the cold-sprayed aluminum coating has a thickness of at least about twice that of the anodized coating.

12. The component of claim 9, wherein the anodized coating has a breakdown voltage of at least about 0.6 kV and/or the component does not produce hydrogen bubbles from an HCl bubble test for at least 5 hours.

13. A method of plasma processing a semiconductor substrate in a plasma processing chamber comprising the component according to claim 1, the method comprising:

supplying at least one process gas from a process gas source into the plasma processing chamber;

applying RF energy to the process gas using the RF energy source to generate plasma in the plasma processing chamber; and plasma processing a semiconductor material, insulator or metallic material on a substrate in the plasma processing chamber.

14. The method of claim 13, wherein the plasma processing comprises an etching process, a cleaning process, a deposition process, a resist-stripping process or a degas process.

15. The method of claim 13, wherein the supplying at least one process gas comprises supplying at least one of $Cl_2$, HCl, $BCl_3$, $Br_2$, HBr, $O_2$, $H_2O$, $SO_2$, $CF_4$, $CH_2F_2$, $NF_3$, $CH_3F$, $C_2F_6$, $CHF_3$ and $SF_6$.

16. A method of making the coated component of claim 1, comprising:

cold-spraying an aluminum coating onto at least a portion of a substrate of the plasma processing chamber such that the cold-sprayed aluminum coating comprises 100 ppm or less of each of Mn, Si, Ni, Cr, Cu, V, Fe, Mg, Zn, Ti, B, Pb, Zr, Bi, Sn and Ca.

17. The method of claim 16, wherein the cold-sprayed aluminum coating comprises at least 99.99 wt. % Al and the substrate comprises AL6061-T6.

18. The method of claim 16, further comprising at least one of machining the aluminum coating or anodizing the aluminum coating; and optionally wet cleaning the component with a cleaning solution after the machining and/or anodizing.

19. The method of claim 18, wherein the anodizing comprising anodizing in an acid bath comprising at least one of oxalic acid and sulfuric acid.

20. The component of claim 1, wherein the cold-sprayed aluminum coating has a thickness of at least 20 mils.

21. The component of claim 1, wherein the cold-sprayed aluminum coating comprises 25 ppm or less of each of V, B, Pb, Zr, Bi, Sn and Ca.

* * * * *